(12) United States Patent
Hasan

(10) Patent No.: US 6,776,827 B2
(45) Date of Patent: Aug. 17, 2004

(54) METHOD AND SOLUTION FOR TREATING FLUOROCARBON SURFACES

(76) Inventor: Syed M. Hasan, 9852 Vicksburg, Huntington Beach, CA (US) 92646

( * ) Notice: Subject to any disclaimer, the term of this patent is extended or adjusted under 35 U.S.C. 154(b) by 57 days.

(21) Appl. No.: 10/253,942

(22) Filed: Sep. 23, 2002

(65) Prior Publication Data

US 2004/0055503 A1 Mar. 25, 2004

(51) Int. Cl.⁷ ................................................ C09D 5/00
(52) U.S. Cl. ................... 106/1.11; 106/287.2; 156/314; 134/42; 427/532; 216/18; 428/421; 428/422; 428/901
(58) Field of Search ........................... 106/1–11, 287.2; 156/314; 134/42; 427/532; 216/18; 428/421, 422, 901

(56) References Cited

U.S. PATENT DOCUMENTS

| 2,230,654 A | 2/1941 | Plunkett |
| 2,809,130 A | 10/1957 | Rappaport |
| 4,744,857 A | 5/1988 | Nelson |
| 4,940,554 A | * 7/1990 | Grapentin et al. .......... 516/203 |
| 5,580,616 A | 12/1996 | Niino et al. |
| 5,627,079 A | 5/1997 | Gardella, Jr. et al. |

FOREIGN PATENT DOCUMENTS

| GB | 890466 | 2/1962 |
| GB | 1043233 | 9/1966 |

* cited by examiner

Primary Examiner—David Brunsman
(74) Attorney, Agent, or Firm—Walter A. Hackler

(57) ABSTRACT

A method and solution to activate and metallize the surface of a fluorocarbon material, suitable for circuit boards is disclosed. The surface of fluorocarbon materials is both hydrophobic and oleophobic, and highly inert and repellent to oils, dyes, adhesive and coatings. The method of the present invention makes such fluorocarbon materials wettable with metallizing solutions and chemicals, and also bondable with adhesives and coatings. The method comprises contacting said fluorocarbon surface with a mixture comprising a cyclic amide, a quaternary ammonium compound, a cationic or nonionic surfactant, a glycolether and an organic acid.

23 Claims, 7 Drawing Sheets

(3 of 7 Drawing Sheet(s) Filed in Color)

(EXAMPLE I)

(EXAMPLE II)

(EXAMPLE III)

(EXAMPLE IV)

(EXAMPLE V)

(EXAMPLE VI)

| No | CC 711 | ME 713 | CPD 716 | CD 720 | AC 731 | ECP 750 | | Back light Test Grade |
|---|---|---|---|---|---|---|---|---|
| 1 | 5% 155°F 5 min. | 1 lb/gal. Room 3 min. | 2 lb/gal. Room 3 min. | 3% 100°F 10 min. | 10% Room 3 min. | 10%A, 10%B 85°F 15 min. |  | 4.8 – 5.0 |
| 2 | 5% 155°F 5 min. | 1 lb/gal. Room 3 min. | 2 lb/gal. Room 3 min. | 3% 100°F 5 min. | 10% Room 2 min. | 10%A, 10%B 85°F 10 min. |  | 4.8 – 4.9 |
| 3 | 5% 155°F 5 min. | 1 lb/gal. Room 3 min. | 2 lb/gal. Room 3 min. | 3% 100°F 5 min. | 10% Room 2 min. | 10%A, 10%B 85°F 15 min. |  | 4.9 – 5.0 |
| 4 | 5% 155°F 5 min. | 1 lb/gal. Room 3 min. | 2 lb/gal. Room 3 min. | 3% 100°F 5 min. | 10% Room 2 min. | 10%A, 10%B 85°F 20 min. |  | 4.9 – 5.0 |
| 5 | 5% 155°F 5 min. | 1 lb/gal. Room 3 min. | 2 lb/gal. Room 3 min. | 3% 100°F 5 min. | 10% Room 2 min. | 10%A, 10%B 85°F 10 min. |  | 4.75 |
| 6 | 5% 155°F 5 min. | 1 lb/gal. Room 3 min. | 2 lb/gal. Room 3 min. | 3% 100°F 5 min. | 10% Room 2 min. | 10%A, 10%B 85°F 15 min. |  | 4.75 |

FIGURE 15

METHOD AND SOLUTION FOR TREATING FLUOROCARBON SURFACES

BACKGROUND OF THE INVENTION

1. Field of the Invention

The present invention provides a method to prepare fluorocarbon surfaces for bonding, as for example in electroless and electrolytic plating. This is particularly useful in the preparation of circuit boards. The surface of a fluorocarbon material does not normally permit bonding and wetting. The surface of fluorocarbon materials e.g. fluorocarbon resins is both hydrophobic and oleophobic. Because of this, only liquids with low surface tensions are capable of wetting fluorocarbon surfaces.

2. Description of the Art

Fluorinated polymers such as polyvinyl fluoride (PVF) and polytetrafluoroethylene (PTFE) are characterized by extreme interness, high thermal stability, hydrophobicity, and a low coefficient of friction. Because of these properties, these and other fluorocarbon polymers resist adhesion to almost any material. The properties of fluorocarbon materials are highly desirable for many industrial and consumer applications. However, it may be necessary to modify certain characteristics of fluorocarbon materials to enable the fluorocarbon polymers to be bonded to different materials, or surface coated, such as, for example, in the manufacture of circuit boards as hereinabove noted.

The following are representative of the methods used presently to bond and wet the surface of fluorocarbon polymers, which methods are either very tedious or unfriendly to the environment or very uneconomical and impractical.

1) Vapor Blasting: This method increases the roughness of the surface, which lowers the contact angle. This method however gives very unsatisfactory peel strength, when other materials are adhesively bounded to a fluorocarbon surface.

2) Corona Blasting: This method is effective for use with certain fluorocarbon polymers, such as fluorinated ethylene-propylene copolymers (FEP). In this method, high frequency; high voltage and alternating current is used to produce a corona discharge. Some modifications may be made to make this process useable with other fluorocarbons such as PTFE.

3) Molten Alloy Treatment: Treatment of the fluorocarbon in a molten alloy of tin and lead (63/37%), respectively, with sodium, is carried out at a temperature below a eutectic point of the alloy.

4) Sodium Anhydride Treatment: In this method, the fluorocarbon polymer is treated with sodium anhydride and then subjected to a helium atmosphere at 350° C.

5) Sodium Ammonia Treatment:

The fluorocarbon material, according to this treatment, is immersed in anhydrous ammonia and an alkali metal like sodium. The process is very unattractive because of ammonia fumes and the hazardous nature of anhydrous ammonia and sodium.

Examples of the above methods of treating fluorocarbon surface, as well as other methods for increasing the wettability of fluorocarbon surfaces, are found in the following patents:

U.S. Pat. No. 5,627,079 to Gardella, Jr., et al. discloses a method of increasing the wettability of a fluorocarbon film by treating such film with a gas/vapor mixture of $H_2$ and one of $H_2O$, $CH_3OH$ or $H_2CO$ under vacuum and in the presence of a radio frequency glow discharge.

British Patent 1,043,233 discloses etching fluorocarbon with polyarylsodium followed by depositing electroless copper on the etched fluorocarbon.

U.S. Pat. No. 2,789,063 discloses etching a fluorocarbon surface with a fluid metal reactant, e.g. lithium vapor, liquid sodium, a liquid alloy of Pb—Sn—Na, NaH or $CaH_2$ British Patent 890,466 discloses treating a perfluorocarbon resin with a corona discharge followed by applying an adhesive and laminating with copper.

U.S. Pat. No. 5,580,616 to Niino discloses treating a fluorocarbon polymer surface with UV in the presence of hydrazine to make said surface hydrophilic. (The hydrophilic surface can be treated chemically to deposit a metal film thereon or made lipophilic by treating with an acid anhydride).

Fluorocarbon materials are used in many applications, e.g. in the manufacturing of printed circuits boards, the manufacture of co-axial cables having polytetrafluoroethylene as the dielectric, etc. Several methods are used to provide conducting finishes and necessary surface preparations to these fluorocarbon materials. These methods include the metallization or surface treatments described above. However, the above methods of treating fluorocarbon materials have disadvantages which are overcome by the method of the present invention.

In particular the disadvantages of the prior art methods for activating fluorocarbon surfaces include:

High vapor pressure builds due to the volatile solvent used in most of the chemicals of the prior art;

Most of the chemicals of the prior art have a low flash point;

The chemicals of the prior art require refrigerated storage in most of the cases;

Many of the chemicals are very sensitive to moisture and air contamination; and

The chemicals of the prior art have very limited shelf life, for example a maximum of about 2 hours, particularly when the chemicals are exposed to air, mixed with water or contaminated with moisture.

SUMMARY OF INVENTION

The present invention provides a method of activating a fluorocarbon surface to render such surface active to metal coating and/or organic adhesives or inks, which comprises contacting said surface with a mixture comprising a cyclic amide, a quaternary ammonium compound, a cationic or nonionic surfactant, a glycol ether and an organic acid.

The chemicals used in the method of the present invention are a mixture of a cyclic amide, a quaternary ammonium compound, a cationic or non-ionic surfactant, a glycol ether and an organic acid.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The present invention may be more clearly appreciated when taken in conjunction with the accompanying drawings, in which:

FIG. 15 shows the results of backlight testing of the examples.

With reference to the Figures, the present invention is described in connection with the production or manufacture of circuit boards, however, it should be appreciated that the invention is not limited thereto.

Figure 1:
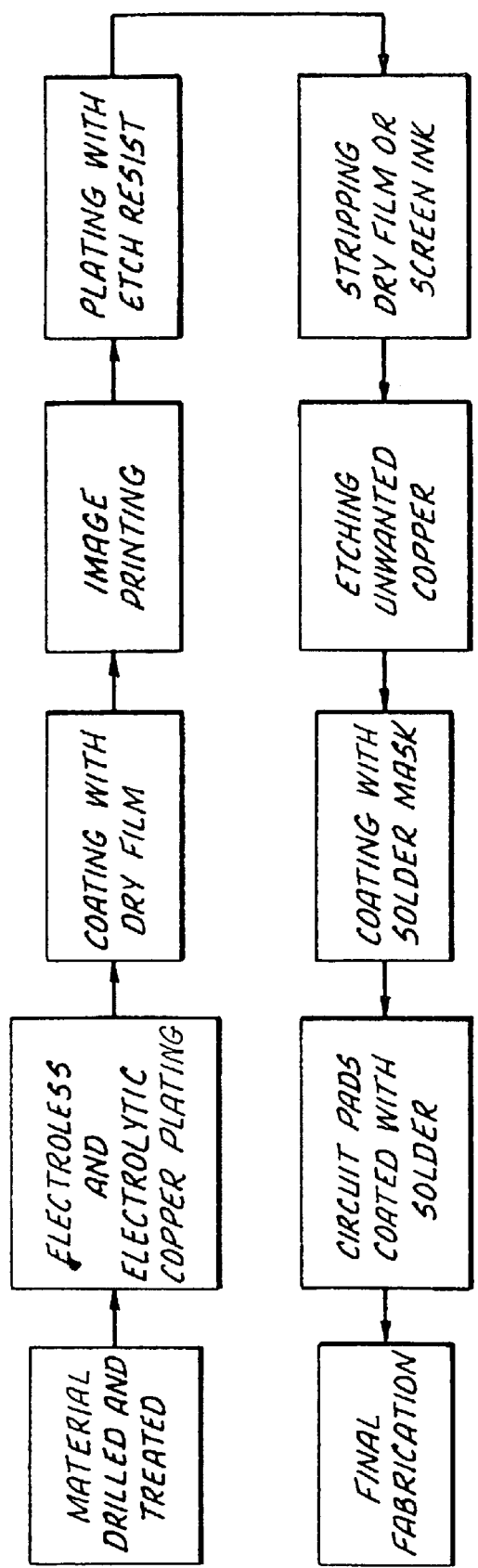
FIG. 1 is a block diagram of a method for production of a circuit board utilizing the methods and solutions of the present invention.
Figure 2:
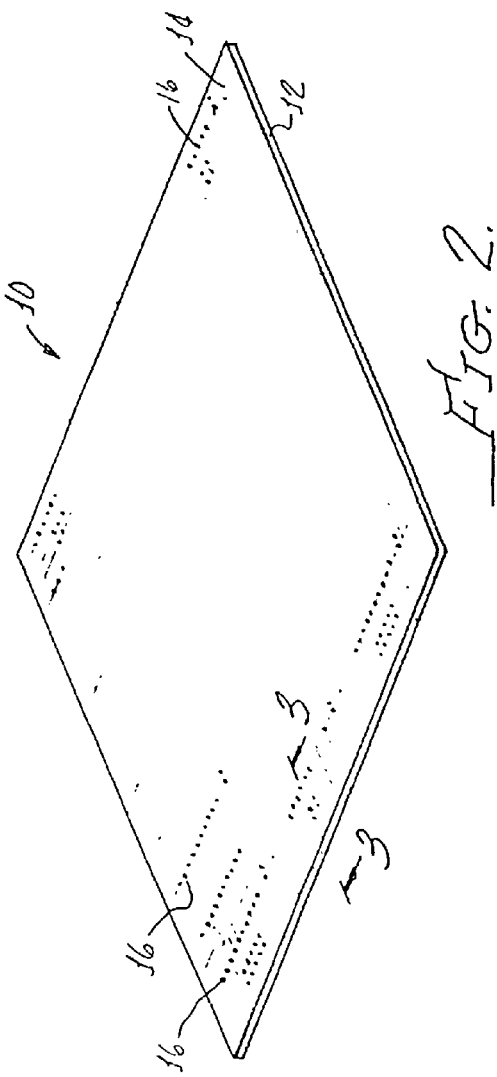
FIG. 2 is a perspective view of a fluorocarbon substrate material after drilling and treatment with the solutions of the present invention.

More specifically, with regard to FIG. 1 there is shown a block diagram illustrating a fluorocarbon material which has been treated with a mixture, to activate the fluorocarbon surface as hereinafter described, and thereafter electroless and electrolytic copper plated as illustrated in FIG. 2. Image printing is thereafter performed on the plated surface after coating with dry film. Thereafter plating is done with an etch resistant coating, the dry film is stripped and a solder mask is coated and thereafter etched to remove unwanted copper. Molten solder may be applied to form circuit pads surrounding holes to facilitate connection of components. Final fabrication follows.

Figure 3:
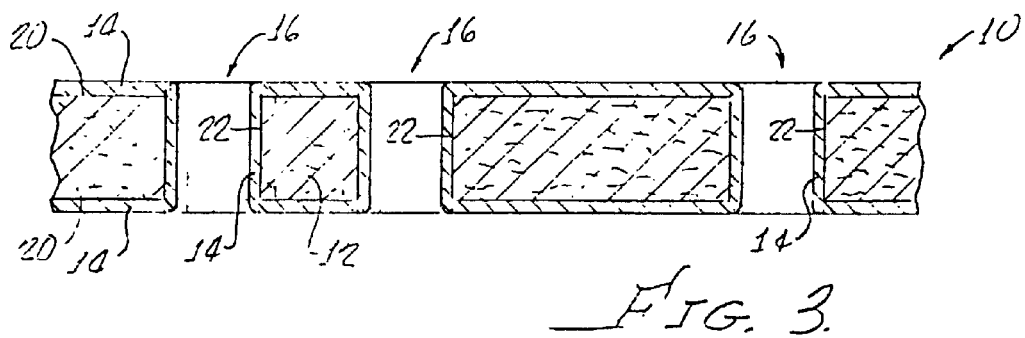
FIG. 3 is a partial cross section of the material taken along the lines 3—3 more clearly showing adhesion of electroless copper plate uniformly coating the material surface without pores.

FIGS. 2 and 3 illustrate a circuit board 10 comprising a fluorocarbon substrate 12 which includes a surface 14 that has been activated in accordance with the present invention utilizing the mixtures, or solutions, of the present invention and thereafter electroless copper applied thereto.

Numerous holes 16 may be drilled through the substrate 12 in order to provide innerconnection therethrough. As illustrated in FIG. 3 the method and mixture, or solution, in accordance with the present invention enables a uniform coating not only of the surface 20 of the substrate 12 with electroless copper, but in addition, inner surfaces 22 of the hole 16 are also uniformly coated with copper 14 as will be hereinafter described in greater detail.

Figure 4:
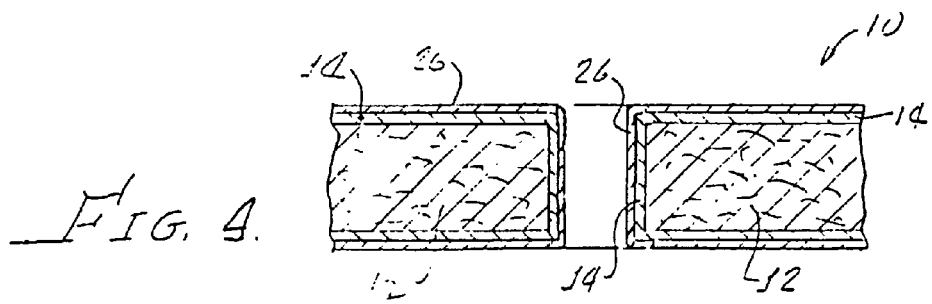
FIG. 4 is a view similar to FIG. 3 showing the cross section following electrolytic plating of copper onto the electroless copper.

Following electroless plating as illustrated in FIG. 4, the board is electrolytically plated with a coating 26 of copper in a conventional manner.

Figure 5:
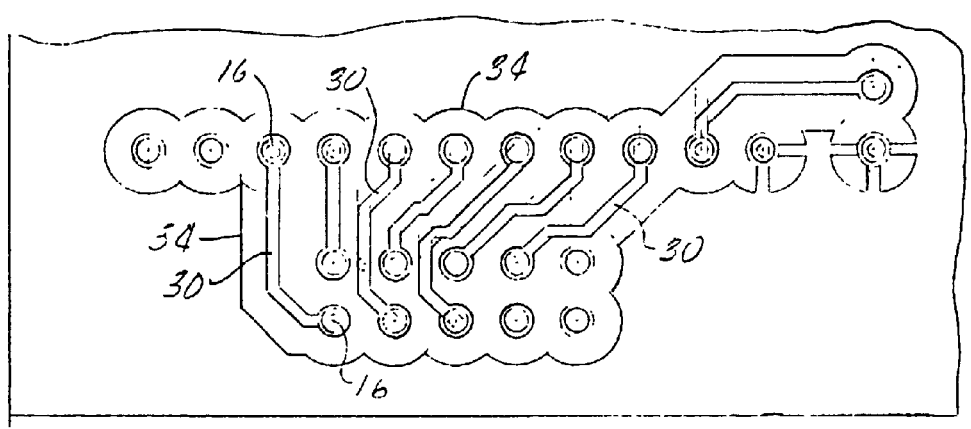
FIG. 5 is a illustration of image printing of the plated board for isolating various desired electrical interconnections to be established on a side of a finished circuit board.
Figure 6:
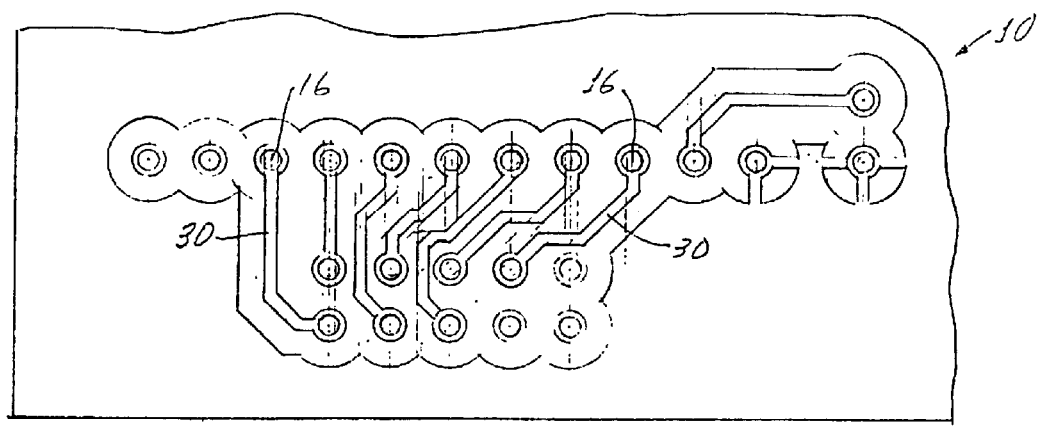
FIG. 6 is an illustration of the board following the etching of undesired copper and leaving the desired copper interconnections.

As illustrated in FIG. 5, the next step in the production of a circuit board is the image printing of innerconnections (circuit pattern) 30 for providing continuous electrical connection between adjacent holes 16 in a conventional manner. The circuit pattern is then plated with Etch Resist metal such as, for example, tin, lead and the like. Thereafter, the unwanted copper coating illustrated by the perimeter line 34 is removed by etching in a conventional manner leaving the innerconnecting copper lines 30 between selected holes as illustrated in FIG. 6.

Figure 7:
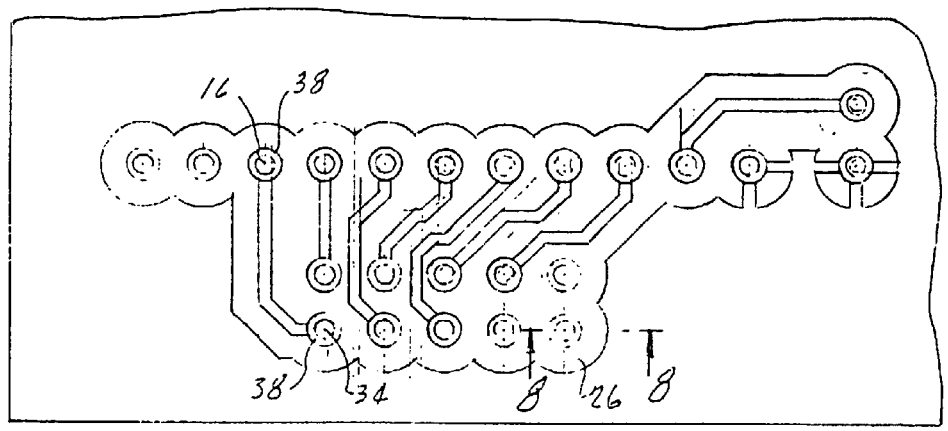
FIG. 7 is an illustration of the board shown in FIG. 6 wherein circuit pads surrounding the holes are coated with solder for facilitating electrical connection therewith.
Figure 8:
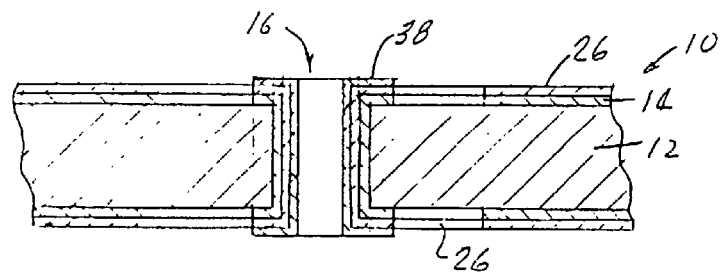
FIG. 8 is a cross section of a hole taken along the line 8—8 of FIG. 7.

Subsequently, areas, or pads, 38 may be coated with solder to facilitate innerconnections in a conventional manner. (See FIG. 7) A cross section of one of the holes through the substate 12 with the solder pads 38 along with the electrolytic copper plate 26 and the electroless copper 14 is illustrated in FIG. 8.

It should be appreciated that the hereinabove described production of a circuit board utilizing the mixtures, or solutions, in accordance with the present invention is provided for illustrative purposes only. The mixture in accordance with the present invention is effective for activating a fluorocarbon surface for the acceptance of any type of coating or ink as hereinabove noted and hereafter described.

DETAILED DESCRIPTION OF THE INVENTION

The mixture, or solution, used to activate the fluorocarbon surface comprises five different groups of chemical including a surfactant.

The cyclic amide may be selected from the group consisting of:

Compounds represented by the general formula I

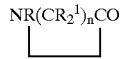

Wherein R is selected from the group consisting of H and $C_1$–$C_4$ alkyl, $R^1$ is selected from the group consisting of H and $C_1$–$C_4$ alkyl and n is an integer of from 3 to 7.

Preferably the cyclic amide is selected from the group consisting of:

a) 1 Methyl-2-Pyrrolidinone
b) 3 Methyl-2-Pyrrolidinone
c) 5 Methyl-2-Pyrrolidinone The amount of the cyclic amide used may be between 1 and 25% by volume of the mixture e.g. about 25%.

The glycol ether may be selected from the group consisting of compounds represented by the general formula II separate lines like formula I, above

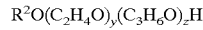

wherein $R^2$ is $C_1$–$C_4$ alkyl, y is 0 or an integer of from 1 to 4 and z is 0 or an integer of from 1 to 4; provided however both y and z cannot be 0. Preferably, the glycol ether is selected from the group consisting of propylene glycol methyl ether, dipropylene glycol methyl ether, tripropylene glycol methyl ether and ethylene glycol-n-butyl ether.

The amount of the Glycol Ether used in the mixture may be between 1 and 25% by volume.

The organic acid may be selected from the group consisting of alkyl carboxylic acids having one or two carboxylic acid groups and substituted with one or more, e.g. one or two, hydroxyl groups. In general, the alkyl carboxylic acid will include from 2 to 15 carbon atoms, e.g. from 2 to 10 carbon atoms. Preferably the organic acid is selected from the group consisting of hydroxy acetic acid, acetic acid, propionic acid; glycolic acid and adipic acid.

The amount of organic acid may be between 1 and 25% by volume of the mixture.

The quaternary ammonium compound may be selected from the group consisting of $(R^3)_4N^+X^-$ wherein $R^3$ is independently selected from the group consisting of $C_1$ to $C_{20}$ alkyl and benzyl groups or two of such R groups, together with N and O, may represent a ring structure, e.g. morpholine, and X is an anion e.g. a halide, sulfate or carboxylate ion. Preferably, the quaternary ammonium compound is selected from the group consisting of blends of Alkyl dimethyl benzyl ammonium chlorides and alkyl dimethyl ethyl benzyl ammonium chloride, blends of alkyl dimethyl benzyl ammonium chlorides, crystalline quaternary ammonium chloride and N-cetyl-n-ethyl morpholinium ethosulfate.

The volume of the quaternary ammonium compound may be between 1 and 25% by volume.

The surfactants are preferably be selected from the following groups:

1) N,N-Dimethyl-1 dodecylamine-N-oxide
2) N,N-Dimethyl-1-tetradecylamine-N-oxide
3) N,N-Dimethyl-1-hexadccylamine-N-oxide
4) Branched alkyldimethylamine oxide.

However, the following surfactant groups may also be utilized.

1) $4(C_9H_{19})C_6H_6OCH_2CH_2OH$
2) $4(C_9H_{19})C_6H_4O(CH_2CH_2O)_4$
3) $4(C_9H_{19})C_6H_4O(CH_2CH_2O)_{11}CH_2CH_2OH$
4) $4(C_9H_{19})C_6H_4O(CH_2CH_2O)_{30}CH_2CH_2OH$

In general, the fluorocarbon surface to be activated is contacted with, e.g. by immersion in, a mixture of a cyclic amide, a quaternary ammonium compound, a cationic or non-ionic surfactant, a glycol ether and an organic acid for a time and at a temperature sufficient to activate the surface to receive a coating, which coating may be a metal, an organic adhesive or other organic coating, etc. The temperature may vary between 165° F. and 190° F., preferably between 170° F. and 180° F., e.g. about 150° F. The time for such contact may vary between about 5 minutes and about 10 minutes, e.g. about 6 minutes. Examples of suitable contact times and temperatures may be found in the Examples, below.

The following are specific examples of the method of the present invention.

EXAMPLE 1

A total volume of 1 liter of solution was made with the following composition:

| | |
|---|---|
| N-Cetyl-N-ethyl Morpholinium Etho Sulfate | 10 cc |
| Tetrahydrofuran | 250 cc |
| Iso Alkyl Amine (Surfactant) | 10 cc |
| Hydroxy Acetic Acid | 20 cc |
| Tri Propylene Glycol Methyl Ether | 20 cc |
| Fluoboric Acid | 250 cc |
| Water | Balance to make 1 liter |

Fluoboric acid was used as a chemical to activate the surface of fluorocarbon, but causes the solution to be unstable, i.e. the solution separated within 2 hours after cooling to room temperature. This instability is typical of prior art solutions.

Six coupons of the sizes 6.0"×8.0" were used for this experiment. Three of the coupons above were from Taconic Company PTFE reinforced CER-10, which is 90% PTFE—with Ceramic. The other three coupons were FR4 material; hole sizes from 0.010–0.030. All were processed in the solution of the invention at 180° F. for 5 minutes and rinsed thoroughly with deionized water.

The coupons were then processed with H&R Superchem's complete line of Electroless copper available from H&R Chemicals, Inc., Huntington Beach, Calif. with the following parameter:

1) H&R SuperChem CC 711 Conditioner Cleaner (5% solution at 155° F. for 5 minutes).
2) The coupons after rinsing were immersed in ME 713 solution (1 lb per gallon) at room temperature for 5 minutes.
3) The coupons after rinse were immersed in CPD 716 solutions at room temperature for 3 minutes.
4) The coupons were then immersed in CD 720 Catalyst (3% solution) at 100° F. for 5 minutes.
5) The coupons after being rinsed thoroughly were immersed in AC 731 Accelerator (10% solution) at room temperature for 5 minutes.
6) The CER-10 coupons, after rinsing, were immersed in H&R SuperChem ECP 750 Electroless Copper (10% ECP 750-A & 10% ECP 750-B) at 85° F. for 30 minutes for PTFE material. The FR-4 material coupons were immersed in the above Electroless Copper Solution for 15 minutes. The coupons after Electroless Plating were examined under 50× magnification. The drilled holes of many sizes from 0.012"–0.022" did not show any void or any other undesirable defects. The coupons showed excellent adhesion with no separation. The coupons were then electrically plated in Acid Copper Electrolyte at 25 ASF for one hour.

The coupons were afterwards subjected to structural integrity tests, which included baking and conditioning the coupons at elevated temperatures of between 250–300° F.

After conditioning, the specimens were placed in a desiccator on a ceramic plate to cool. Each of the specimens were then fluxed (type ROL1 per J-STD-400) and floated in a solder bath of composition Sn60Pb40 or Sn63Pb37 maintained at temperature of 288° C.(550° F.) for 10 seconds ±3 seconds. Solder temperature was measured at a probe depth not to exceed 19 mm (+/−6.4 mm) from the molten surface of the solder. After thermal stressing, the specimens were placed on a piece of insulator to cool. The specimens were then micro sectioned and evaluated for plating quality.

Figure 9:
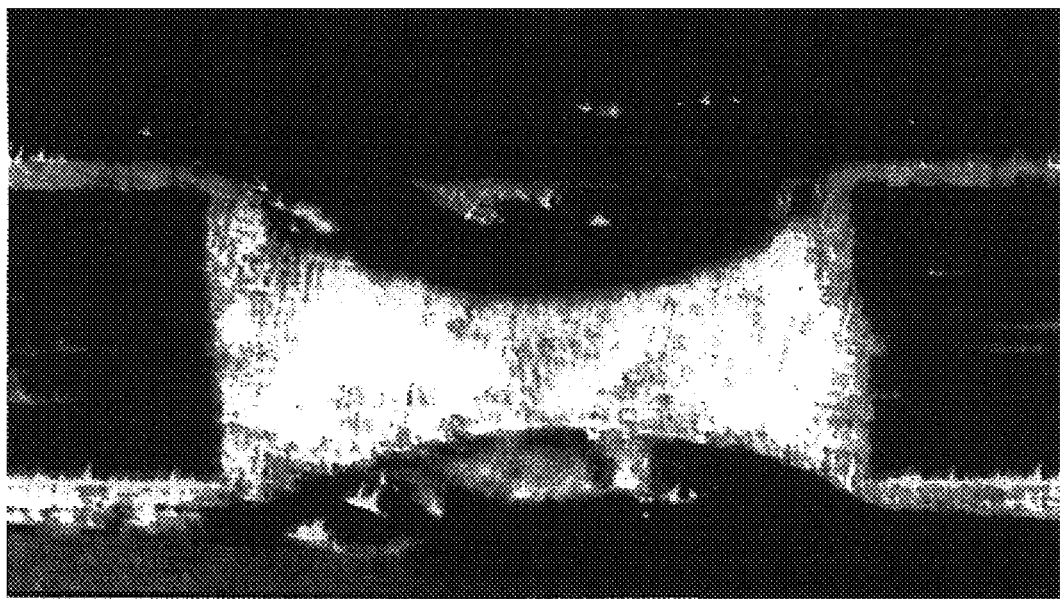
FIGS. 9–14 are photographs of cross-sectioned boards depicted in FIG. 4 and showing uniform copper coating.

Micro sectioning was accomplished by using semi-automatic techniques. The specimens were then etched with a solution of ammonium hydroxide, hydrogen peroxide, and de-ionized water. Coupons were checked for hole wall integrity, which include but not limited to hole wall separation, voiding, cracking, blistering, or any other hole wall imperfection. Isolated thin or thick areas were not used for averaging. The micro sections were examined using metallurgical microscope, and evaluated at a magnification of 100×–400×. Typical results are shown in FIG. 9.

Evaluation of the sample in a back-light test and PTFE through hole plating was performed.

The plated FR4 coupons were analyzed by back-light testing using metallurgical microscope and industrial video adaptable digital camera with monitor. The coupons were rated using 50×–60× optical magnification and shown in FIG. 15, No.1.

Recent developments in electroless copper processing have increased the demand for near perfect hole coverage. Many intensive tests of hole-coverage have been developed for total quality control. The most accepted test is the back-light test, also known as the black-hole test. In this test, visible light is transmitted through the translucent epoxyglass coupon, perpendicular to the back of the hole-surface, while the front of the hole-surface is observed under a microscope. A perfectly plated hole blocks all light, and so the hole-surface appears completely black. Plating-voids in the hole-surface appear as specks of light, and hole coverage is graded based on the number and size of observed voids. Many PTH chemical suppliers have their own back-light grading systems.

The back-light test can be performed immediately after electroless copper plating, in which case the test reveals the quality of the electroless copper processing. Alternatively, the test can be performed after copper flash treatment. The coupons described in this report were tested immediately after electroless copper plating, and graded using Taiwan's back-light rating chart.

Processes that precede electroless copper plating, such as, for example, lamination and drilling can also influence hole-coverage. The back-light test does not reveal the source of observed voids, making it necessary to appraise all of the operations performed before the back-light test.

The above solution may be varied as shown below and similar results may be obtained.

|  | RANGE |
| --- | --- |
| N-Cetyl-N-ethyl Morpholinium Etho Sultate | 5–50 cc |
| Tetrahydrofuran | 25–500 cc |
| Iso Alkyl Amine (Surfactant) | 5–50 cc |
| Hydroxy Acetic Acid | 10–100 cc |
| Tri Propylene Glycol Methyl Ether | 10–100 cc |
| Fluoboric Acid | 25–500 cc |
| Water | Balance to make 1 liter |

EXAMPLE II

A total volume of 1 liter of solution was made with the following composition:

| N-Cetyl-N-Ethyl Morpholinium Etho Sulfate | 10 cc |
| --- | --- |
| Iso Alkyl Amine (Surfactant) | 10 cc |
| Tetrahydrofuran | 250 cc |
| Hydroxy Acetic Acid | 250 cc |
| Tripropylene Glycol Methyl Ether | 20 cc |
| Fluoboric Acid | 125 cc |
| Water | Balance to make 1 liter |

Six coupons 6.0"×8.0" Copper Clad reinforced material were used for this experiment. Three of the coupons above were Taconic (PTFE X LT-1) and 3 coupons were regular FR4 material as in experiment #1. All the pieces were processed in the solution of the present invention above at 170° F. for 5 minutes. The coupons after thorough rinsing were processed through the entire H&R SuperChem electroless line as in Example #1. Coupons with FR4 material are processed in Electroless Copper Solution were processed for 10 minutes. The coupons after electroless copper were examined under 50× magnification. The coupons with holes sizes, 0.015"–0.022" showed complete coverage with electroless copper and did not show any adhesion defect after tape testing.

The coupons were than electrically plated in Acid Copper Electrolyte at 25 ASF for 1 hour.

The coupons were then subjected to structural integrity tests, which included baking and conditioning the coupons at elevated temperature of 250–300° F.

After conditioning, the specimens were placed in a desiccator on a ceramic plate to cool. Each of the specimens were then fluxed (type ROL1 per J-STD-004) and floated in a solder bath of composition Sn60Pb40 or Sn63Pb37 maintained at temperature of 288° C. (550° F.) for 10 seconds ±3 seconds. Solder temperature was measured at a probe depth not to exceed 19 mm (±6.4 mm) from the molten surface of the solder. After thermal stressing, the specimens were placed on a piece of insulator to cool. The specimens were then micro sectioned and evaluated.

Figure 10:

Micro sectioning was accomplished by using semi-automatic techniques. The specimens were then etched with a solution of Ammonium Hydroxide, Hydrogen Peroxide, and Deionized Water. For hole wall integrity, which include but not limited to hole wall separation, voiding, cracking, blistering, or any other hole wall imperfections. Isolated thin or thick areas not used for averaging. The micro sections were examined using metallurgical microscope, and evaluated at a magnification of 100×. The results are shown in FIG. 10 and Backlight result for the FR4 material are shown as No. 2 in FIG. 15. This solution also separated within 24 hours of cooling to room temperature.

The above solution may be varied as shown below and similar results may be obtained.

|  | RANGE |
| --- | --- |
| N-Cetyl-N-ethyl Morpholinium Etho Sulfate | 5–50 cc |
| Tetrahydrofuran | 25–500 cc |
| Iso Alkyl Amine (Surfactant) | 5–50 cc |
| Hydroxy Acetic Acid | 10–100 cc |
| Tri Propylene Glycol Methyl Ether | 10–100 cc |
| Fluoboric Acid | 25–500 cc |
| Water | Balance to make 1 liter |

EXAMPLE III

A total volume of 1 liter of solution was made with the following composition:

| N-Cetyl-N-ethyl Morpholinium Etho Sulfate | 10 cc |
| --- | --- |
| Iso Alkyl Amine (Surfactant) | 10 cc |
| 1 Methyl-2-Pyrrolidinone | 25 cc |
| Hydroxy Acetic Acid | 20 cc |
| Tri Propylene Glycol Methyl Ether | 20 cc |
| Water | Balance to make 1 liter |

Six coupons as in Example #1, three of the coupons were of PTFE XLT-8-2, available from Taconic, and three of the coupons were of FR4 material. All coupons were processed with the above solution.

Six coupons 6.0"×8.0" were processed for this experiment. Three of the coupons were Taconic's PTFE XLT 8-2 and three of the coupons were regular FR4 material. All the coupons were processed in the solution at 180° F. for 5 minutes. These coupons were then processed in SUPERCHEM'S complete Electroless line as an example #2.

The coupons were then subjected to structural integrity tests, which included conditioning the coupons at elevated temperature of 250–300° F.

After conditioning, the specimens were placed in a desiccator on a ceramic plate to cool. Each of the specimens were then fluxed (type ROL1 per J-STD-004) and floated in a solder bath of composition Sn60Pb40 or Sn63Pb37 maintained at temperature of 288° C.(550° F.) for 10 sec+10. Solder temperature was measured at a probe depth not to exceed 19 mm(+/−6.4 mm) from the molten surface of the solder. After thermal stressing, the specimens were placed on a piece of insulator to cool. The specimens were then micro sectioned and evaluated for the quality of the hole wall integrity observing any evidence of voids, hole wall separation or cracking.

Figure 11:
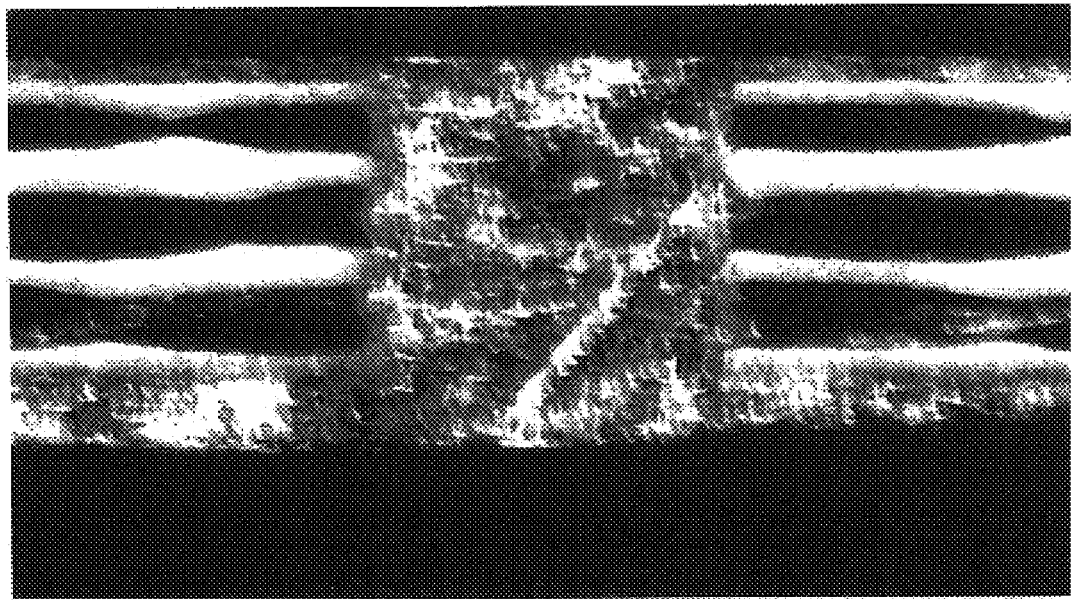

Micro sectioning was accomplished by using semi-automatic techniques. The specimens were then etched with a solution of ammonium hydroxide, hydrogen peroxide, and deionized water. Hole wall integrity, which includes but not limited to hole wall separation, voiding, cracking, blistering, or any other hole wall imperfection was determined. Isolated thin or thick areas not used for averaging. The micro sections were examined using metallurgical microscope, and evaluated at a magnification of 100×. The results are shown in FIG. 11 and Backlight results for the FR4 material shown as No. 3 in FIG. 15.

The above solution may be varied as follows and similar results may be obtained.

|  | RANGE |
| --- | --- |
| N-Cetyl-N-ethyl Morpholinium Ethosulfate | 5–50 cc |
| Iso Alkyl Amine (Surfactant) | 5–50 cc |
| 1 Methyl-2-Pyrrolidinone | 25–500 cc |
| Hydroxy Acetic Acid | 10–100 cc |
| Tri Propylene Glycol Methyl Ether | 10–100 cc |
| Water | Balance to make 1 liter |

EXAMPLE IV

A total volume of 1 liter of solution was made with the following composition:

| | |
| --- | --- |
| N-Cetyl-N-Ethyl Morpholinium Etho Sulfate | 10 cc |
| 1 Methyl-2-Pyrrolidinone | 250 cc |
| Iso Alkyl Amine (Surfactant) | 10 cc |
| Tripropylene Glycol Methyl Ether | 20 cc |
| Water | Balance to make 1 liter |

Six coupons 6.0"×8.0" were used for this experiment. Three coupons were Taconic RFE-5 and three regular FR4 materials. All the coupons were immersed in the solution of the present invention at 180° F. for 5 minutes. The coupons were then treated with SUPERCHEM'S line of chemicals as in Example #3.

The coupons were subjected to structural integrity tests, which included conditioning the coupons at elevated temperature of 250–300° F.

After conditioning, the specimens were placed in a desiccator on a ceramic plate to cool. Each of the specimens were then fluxed (type ROL1 per J-STD-004) and floated in a solder bath of composition Sn60Pb40 or Sn63Pb37 maintained at temperature of 288° C. (550° F.) for 10 seconds ±3 seconds. Solder temperature was measured at a probe depth not to exceed 19 mm (+/−6.4 mm) from the molten surface of the solder. After thermal stressing, the specimens were placed on a piece of insulator to cool. The specimens were then micro sectioned and evaluated.

Micro sectioning was accomplished by using semi-automatic techniques. The specimens were then etched with a solution of ammonium hydroxide, hydrogen peroxide, and deionized water. Hole wall integrity evaluation included but was not limited to hole wall separation voiding, cracking, blistering, or any other hole wall imperfection. Isolated thin or thick areas were not used for averaging. The micro sections were examined using metallurgical microscope, and. evaluated at a magnification of 100×–400×.

Figure 12:
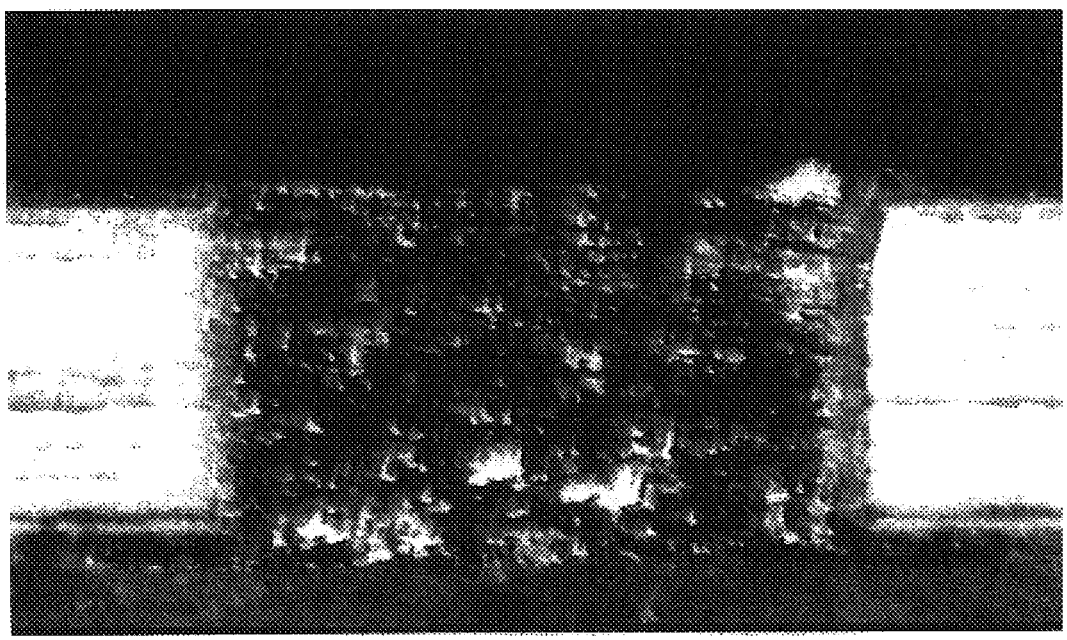

Average of the 3 holes in every cross section were observed. These holes did not show any imperfection like plating separation, voids or cracking. The results are shown in FIG. 12 and backlight results for the FR4 material shown as No. 4 in FIG. 15.

The above solution may be varied as follows and similar results may be obtained.

| | RANGE | OPTIMUM |
| --- | --- | --- |
| N-Cetyl-N-Ethyl Morpholinium Etho Sulfate | 5–50 cc | 10 cc |
| 1 Methyl-2-Pyrrolidinone | 25–500 cc | 250 cc |
| Iso Alkyl Amine (Surfactant) | 5–50 cc | 20 cc |
| Tripropylene Glycol Methyl Ether | 10–100 cc | 20 cc |
| Water | Balance to make 1 liter | |

The solution used to activate the fluorocarbon surface of coupons in Example #1 through example #4 were kept without any use for 4 week and 3 days. The solution showed some precipitate mostly insoluble in the bottom of the glass beaker. The weight of the residue was about 300 Mg, which was filtered using Polypropylene Buckner Funnel with Qualitative filter paper P5, diameter 11.0 Cm, Porosity medium and flow rate slow. The filtered solution looked very clean and worked excellent without any change for coupons in Example #5 and #6. The solution proved to be very stable and the shelf life is expected to be in excess of 90 days without any foreign contaminates or lack of effectiveness.

EXAMPLE V

This solution was made using the following chemicals in the proportions mentioned:

| | |
| --- | --- |
| N-Cetyl-N-ethyl Morpholinium Ethosulfate | 10 cc |
| Iso Alkyl Amine (Surfactant) | 10 cc |
| 1 Methyl-2-Pyrrolidinone | 150 cc |
| Hydroxy Acetic Acid | 20 cc |
| Tri Propylene Glycol Methyl Ether | 20 cc |
| Water | Balance to make 1 liter |

Six coupons of the sizes 6.0×8.0" were used for this experiment. Three of the coupons above were from Taconic material (PTFE RF35). Three other coupons were from FR4 material. Hole sizes ranged from 0.010–0.030. All were processed with the solution of the present invention; Taconic material RF35 is 67% PTFE/CERAMIC-7628 Glass. This material is equivalent to ROGERS 4350, 4003. After rinsing the coupons with water, they were processed with complete Electroless Copper Line of H&R SuperChem. The coupons had good adhesion as shown by Tape Testing. These coupons were Electroplated in Electrolytic Copper solution and subjected to Thermal Stress Test as mentioned below.

The coupons were subjected to structural integrity tests, which included conditioning the coupons at elevated temperature of 250–300° F.

After conditioning the specimens were placed in a desiccator on a ceramic plate to cool. Each of the specimens were then fluxed (type ROL1 per J-STD-004) and floated in a solder bath of composition Sn60Pb40 or Sn63Pb37 maintained at temperature of 288° C. (550° F.) for 10 seconds ±3 seconds. Solder temperature measured at a probe depth not to exceed 19 mm (+/−6.4 mm) from the molten surface of the solder. After thermal stressing, the specimens were placed on a piece of insulator to cool. The specimens were then micro sectioned and evaluated.

Micro sectioning was accomplished by using semi-automatic techniques. The specimens were then etched with a solution of Ammonium Hydroxide, Hydrogen Peroxide, and Deionized water. Hole wall integrity evaluation included but not limited to hole wall separation, voiding cracking, blistering, or any other hole wall imperfection was performed. Isolated thin or thick areas not used for averaging. The micro sections were examined using metallurgical microscope, and evaluated at the magnification of 100×–400×.

Figure 13:
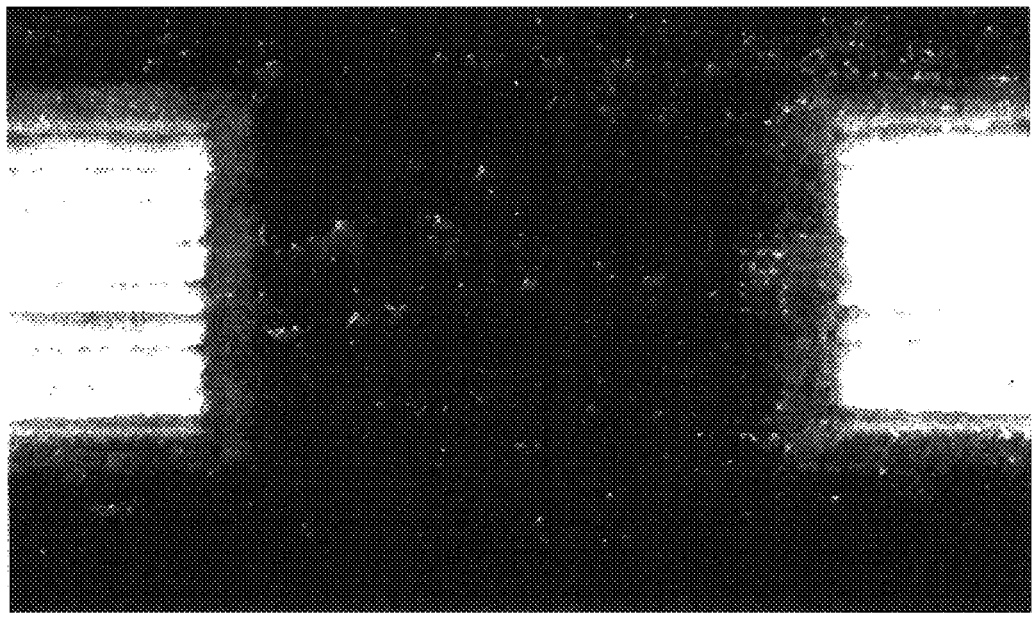

Average of the 3 holes in every cross section were observed. These holes did not show any imperfection like plating separation, voids or cracking. The results are shown in FIG. 13 and backlight results for the FR4 material shown as No. 5 in FIG. 15.

The above solution may be varied as follows and similar results may be obtained.

|  | RANGE |
| --- | --- |
| N-Cetyl-N-ethyl Morpholinium Ethosulfate | 5–50 cc |
| Iso Alkyl Amine (Surfactant) | 5–50 cc |
| 1 Methyl-2-Pyrrolidinone | 25–500 cc |
| Hydroxy Acetic Acid | 10–100 cc |
| Tri Propylene Glycol Methyl Ether | 10–100 cc |
| Water | Balance to make 1 liter |

EXAMPLE VI

This solution was made with the chemicals according to the following order:

| Hydrolxy Acetic Acid | 10 cc |
| --- | --- |
| 1 Methyl-2-Pyrrolidinone | 200 cc |
| Iso Alkyl Amine (Surfactant) | 10 cc |
| N-cetyl-N-Ethyl Morpholinium Etho-Sulfate | 10 cc |
| Tripropylene Glycol Methyl Ether | 20 cc |
| Water | Balance to make 1 liter |

Six coupons of the size 6.0×8.0" were used for this experiment. Three of the coupons above were copper clad reinforced PTFE TLY 03 (Glass reinforced) 92% PTFE only-1080/106 glass and three other coupons were FR4 material. Hole sizes ranged from 0.010–0.030." All were used for this experiment. The coupons were immersed on the solution of the present invention at 170° F. for 5 minutes. Three coupons as in Example #1 from Taconic (PTFE XLT-8-2) were processed with the above solution; Taconic PTFE material used in experiment #3 was the same as in experiment. After rinsing, the coupons were processed through complete H&R SuperChem's Electroless Line and were tested for plating coverage, adherence and ductility using cellophane tape. Electroless Plating showed excellent adherence and complete coverage. The coupons were graded according to back-light test. Please refer to image #6 for the result. The samples were then plated with Electrolytic Copper at 25 ASF for 1 hour.

The coupons were then subjected to structural integrity tests, which included conditioning the coupons at elevated temperature 250–300° F.

After conditioning, the specimens were placed in a desiccator on a ceramic plate to cool. Each of the specimens were then fluxed (type ROL1 per J-STD-004) and floated in a solder bath of composition Sn60Pb40 or Sn63Pb37 maintained at temperature of 288° C. (550° F.) for 10 sec ±3 seconds. Solder temperature shall be measured at a probe depth not to exceed 19 mm (+/−6.4 mm) from the molten surface of the solder. After thermal stressing, the specimens were placed on a piece of insulator to cool. The specimens were then micro sectioned and evaluated for the quality of the hole wall integrity observing any evidence of voids, hole wall separation or cracking.

Figure 14:
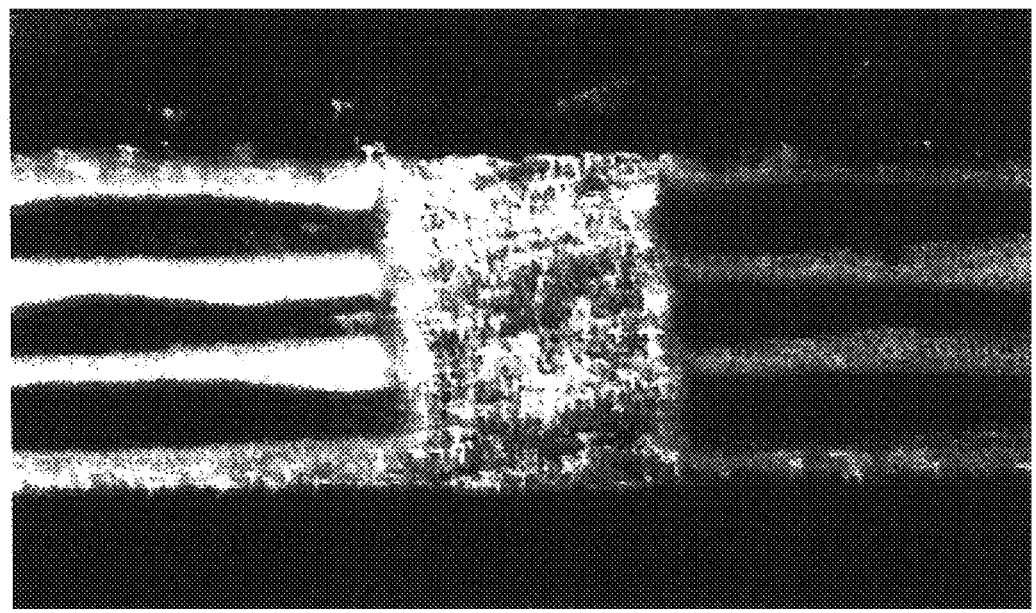

Micro sectioning was accomplished by using semi-automatic techniques. The specimens were then etched with a solution of Ammonium Hydroxide, Hydrogen Peroxide, and Deionized Water. For hole wall integrity, which include but not limited to hole wall separation, voiding cracking, blistering, or any other hole wall imperfection. Measurements are reported as the average three (3) holes. Isolated thin or thick areas not used for averaging. The micro sections were examined using metallurgical microscope, and evaluated at a magnification of 100×–400×. The results are shown in FIG. 14 and backlight for the FR4 material results shown as No. 6 in FIG. 15.

The above solution may be varied as follows and similar results may be obtained.

|  | RANGE |
| --- | --- |
| Hydrooxy Acetic Acid | 10–100 cc |
| 1 Methyl-2-Pyrrolidinone | 25–500 cc |
| Iso Alkyl Amine (Surfactant) | 5–50 cc |
| N-Cetyl-N-Ethyl Morpholinium Etho-Sulfate | 5–50 cc |
| Tripropylene Glycol Methyl Ether | 10–100 cc |
| Water | Balance to make 1 liter |

The solutions utilized in the method of the present invention, as described in Examples I through VII, above, have the following advantages:

The solution does not exert any excessive vapor pressure in the container after long storage.

The solution of the present invention is not classified as flammable.

No refrigeration of the solution needed during storage for example, up to or in excess of 90 days.

The solution is not sensitive to moisture or air. The chemical is recommended to be diluted with water before final use. For uniform activity of the chemical, it may be aerated also during production time.

Experiment VII

Two coupons of FR35, Taconic, 67% PTFE, ceramic-7628 glass were used for this experiment. The coupons were nonclad of the size 3.0"×6.0." This test was performed to evaluate surface adherence of solder mask material on PTFE, RF35. One coupon was immersed in the solutions of the present invention, i.e. the solution of example 3–6, at 170° F. for 5 minutes. A control coupon was not treated with the chemicals. After baking these coupons at 250° F. for 15 minutes, it was observed that untreated coupon showed lots of pits and imperfection, but the treated pieces showed excellent adherence without any pitting or non-coverage.

Although there has been hereinabove described specific methods and solutions in accordance with the present invention for the purpose of illustrating the manner in which the invention may be used to advantage, it should be appreciated that the invention is not limited thereto. That is, the present invention may suitably comprise, consist of, or consist essentially of the recited elements. Further, the invention illustratively disclosed herein suitably may be practiced in the absence of any element which is not specifically disclose herein. Accordingly, any and all modifications, variations or equivalent arrangements which may occur to those skilled in the art, should be considered to be within the scope of the present invention as defined in the appended claims.

What is claimed is:

1. A method of activating a fluorocarbon surface to render such surface active to metal coating and/or organic adhesives or inks, which comprises contacting said surface with a mixture comprising a cyclic amide, a quaternary ammonium compound, a cationic or nonionic surfactant, a glycol ether and an organic acid.

2. The method of claim 1 wherein said cyclic amide is selected from the group consisting of compounds represented by the general formula I

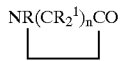

wherein R is selected from the group consisting of H and $C_1$–$C_4$ alkyl, $R^1$ is selected from the group consisting of H and $C_1$–$C_4$ alkyl and n is an integer of from 3 to 7.

3. The method of claim 1 wherein said Glycol Ether is selected from the group of compounds represented by the general formula II

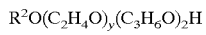

wherein $R^2$ is $C_1$–$C_4$ alkyl, y is 0 or an integer of from 1 to 4 and z is 0 or an integer of from 1 to 4; provided however both y and z cannot be 0.

4. The method of claim 1 wherein said quaternary ammonium compound is selected from the group of $(R^3)_4N^+X^-$ wherein $R^3$ is independently selected from the group consisting of $C_1$ to $C_{20}$ alkyl and benzyl groups or two of such R groups, together with N, and O may represent a ring structure, and X is an anion.

5. The method of claim 1 wherein said organic acid is an alkyl carboxylic acid having one or two carboxylic acid groups and substituted with one or two hydroxyl groups.

6. The method of claim 1 wherein said cyclic amide is selected from the group consisting of methyl pyrrolidinones.

7. The method of claim 1 wherein said quaternary ammonium compound is selected from the group consisting of blends of alkyl dimethyl benzyl ammonium chlorides and alkyl dimethyl ethyl benzyl ammonium chloride, blends of alkyl dimethyl benzyl ammonium chlorides, crystalline quaternary ammonium chloride and N-Cetyl-n-ethyl morpholinium ethosulfate.

8. The method of claim 1 wherein said cationic or nonionic surfactant is selected from the group consisting of:

N,N-Dimethyl-1 dodecylamine-N-oxide

N,N-Dimethyl-1-tetradecylamine-N-oxide

N,N-Dimethyl-1-hexadccylamine-N-oxide

Branched alkyldimethylamine oxide.

9. The method of claim 1 wherein said cationic or nonionic surfactant is selected from the group consisting of $4(C_9H_{19})C_6H_6OCH_2CH_2OH$; $4(C_9H_{19})C_6H_4O(CH_2CH_2O)_4$; $4(C_9H_{19})C_6H_4O(CH_2CH_2O)_{11}CH_2CH_2OH$; and $4(C_9H_{19})C_6H_4O(CH_2CH_2O)_{30}CH_2CH_2OH_4$.

10. The method of claim 1 wherein said glycol ether is selected from the group consisting of propylene glycol methyl ether, dipropylene glycol methyl ether, tripropylene glycol methyl ether and ethylene glycol-n-butyl ether.

11. The method of claim 1 wherein said organic acid is selected from the group consisting of hydroxy acetic acid, acetic acid, propionic acid, glycolic acid and adipic acid.

12. A solution for activating a fluorocarbon surface to render such surface active to metal coating and/or organic adhesives or inks, which comprises a mixture comprising a cyclic amide, a quaternary ammonium compound, a cationic or nonionic surfactant, a glycol ether and an organic acid.

13. The solution of claim 12 wherein said cyclic amide is selected from the group of consisting of compounds represented by the general formula I

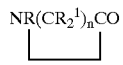

wherein R is selected from the group consisting of H and $C_1$–$C_4$ alkyl, $R^1$ is selected from the group consisting of H and $C_1$–$C_4$ alkyl and n is an integer of from 3 to 7.

14. The solution of claim 12 wherein said glycolether is selected from the group of compounds represented by the general formula II

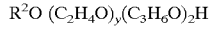

wherein $R^2$ is $C_1$–$C_4$ alkyl, y is 0 or an integer of from 1 to 4 and z is 0 or an integer of from 1 to 4; provided however both y and z cannot be 0.

15. The solution of claim 12 wherein said quaternary ammonium compound is selected from the group of $(R^3)_4N^+X^-$ wherein $R^3$ is independently selected from the group consisting of $C_1$ to $C_{20}$ alkyl and benzyl or two of such R groups, together with N, and O may represent a ring structure, and X is an anion.

16. The solution of claim 12 wherein said organic acid is an alkyl carboxylic acid having one or two carboxylic acid groups and substituted with one or two hydroxyl groups.

17. The solution of claim 12 wherein said cyclic amide is selected from the group consisting of methyl pyrrolidinones.

18. The solution of claim 12 wherein said quaternary ammonium compound is selected from the group consisting of blends of alkyl dimethyl benzyl ammonium chlorides and alkyl dimethyl ethyl benzyl ammonium chloride, blends of alkyl dimethyl benzyl ammonium chlorides, crystalline quaternary ammonium chloride and N-Cetyl-n-ethyl morpholinium ethosulfate.

19. The solution of claim 12 wherein said nonionic surfactant is selected from the group consisting of mixture of:

N,N-Dimethyl-1 dodecylamine-N-oxide

N,N-Dimethyl-1-tetradecylamine-N-oxide

N,N-Dimethyl-1-hexadccylamine-N-oxide

Branched alkyldimethylamine oxide.

20. The solution of claim 12 wherein said cationic or nonionic surfactant is selected from the group consisting of: $4(C_9H_{19})C_5H_6OCH_2CH_2OH$; $4(C_9H_{19})C_6H_4O(CH_2CH_2O)$ $_4$; $4(C_9H_{19})C_6H_4O(CH_2CH_2O)_{11}CH_2CH_2OH$; and $4(C_9H_{19})C_6H_4O(CH_2CH_2O)_{30}CH_2CH_2OH$.

21. The solution of claim 12 wherein said glycol ether is selected from the group consisting of propylene glycol methyl ether, dipropylene glycol methyl ether, tripropylene glycol methyl ether and ethylene glycol-n-butyl ether.

22. The solution of claim 12 wherein said organic acid is selected from the group consisting of hydroxy acetic acid, acetic acid, propionic acid, glycolic acid and adipic acid.

23. A circuit board formed by the steps of:

drilling holes through a fluorocarbon substitute;

activating a surface of the substrate, including hole sidewalls, with a mixture comprising a cyclic amide, a quaternary ammonium compound, a cationic or non-ionic surfactant, a glycol ether and an organic acid;

electroless plating the activated surface with copper;

electroplating the electroless plated surface;

printing an image of desired interconnection onto the electroplated surface; and etching unwanted copper from the image printed surface.

* * * * *